United States Patent
Zhu et al.

(10) Patent No.: US 10,049,007 B2
(45) Date of Patent: Aug. 14, 2018

(54) NON-VOLATILE MEMORY DEVICE AND READ METHOD THEREOF

(71) Applicant: VIA TECHNOLOGIES, INC., New Taipei (TW)

(72) Inventors: Jiangli Zhu, San Jose, CA (US); Ying Yu Tai, Mountain View, CA (US)

(73) Assignee: VIA TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 15/243,323

(22) Filed: Aug. 22, 2016

(65) Prior Publication Data

US 2017/0123905 A1 May 4, 2017

Related U.S. Application Data

(60) Provisional application No. 62/247,201, filed on Oct. 28, 2015.

(51) Int. Cl.
| | |
|---|---|
| *G06F 11/00* | (2006.01) |
| *G06F 11/10* | (2006.01) |
| *G06F 3/06* | (2006.01) |
| *G11C 29/52* | (2006.01) |

(52) U.S. Cl.
CPC ........ *G06F 11/1068* (2013.01); *G06F 3/0619* (2013.01); *G06F 3/0659* (2013.01); *G06F 3/0679* (2013.01); *G11C 29/52* (2013.01)

(58) Field of Classification Search
CPC .. G06F 11/1068; G06F 3/0619; G06F 3/0659; G06F 3/0679; G11C 29/52
See application file for complete search history.

(56) References Cited

U.S. PATENT DOCUMENTS

| | | | |
|---|---|---|---|
| 8,140,939 B2 * | 3/2012 | Colmer | G06F 11/1068 |
| | | | 714/763 |
| 8,539,313 B2 | 9/2013 | D'Abreu et al. | |
| 8,681,569 B2 * | 3/2014 | Yang | G11C 16/06 |
| | | | 365/185.03 |
| 9,230,673 B2 * | 1/2016 | Yang | G06F 3/064 |
| (Continued) | | | |

FOREIGN PATENT DOCUMENTS

| | | |
|---|---|---|
| TW | 201230054 A | 7/2012 |
| TW | 201314449 A | 4/2013 |

OTHER PUBLICATIONS

Chinese language office action dated Oct. 20, 2017, issued in application No. TW 105130409.

*Primary Examiner* — Esaw T Abraham
(74) *Attorney, Agent, or Firm* — McClure, Qualey & Rodack, LLP

(57) ABSTRACT

A non-volatile memory device including a non-volatile memory and a controller is provided. The controller establishes a standard table and at least one priority table according to a read table stored in the non-volatile memory. The probability that the controller utilizes the read voltages corresponding to the indexes recorded in the priority table to read and successfully decode the codewords stored in non-volatile memory is high. When the controller utilizes the read voltages corresponding to the indexes recorded in the priority table to read and unsuccessfully decode the codewords, the controller utilizes the read voltages corresponding to the indexes recorded in the standard table to read and decode the codewords stored in non-volatile memory.

24 Claims, 3 Drawing Sheets

(56) References Cited

U.S. PATENT DOCUMENTS

| | | | |
|---|---|---|---|
| 9,250,990 B2* | 2/2016 | Motwani | G06F 11/076 |
| 9,257,186 B2* | 2/2016 | D'Abreu | G11C 16/10 |
| 9,268,646 B1* | 2/2016 | Chiu | G06F 3/0619 |
| 9,390,774 B2 | 7/2016 | Sharon et al. | |
| 9,442,028 B2* | 9/2016 | Roussev | G01B 11/16 |
| 9,454,414 B2* | 9/2016 | Micheloni | G06F 11/00 |
| 9,601,219 B2* | 3/2017 | Yang | G06F 11/1012 |
| 9,836,239 B2* | 12/2017 | Yamashita | G06F 3/0638 |
| 2012/0317365 A1 | 12/2012 | Elhamias | |

* cited by examiner

NON-VOLATILE MEMORY DEVICE AND READ METHOD THEREOF

CROSS REFERENCE TO RELATED APPLICATIONS

This application claims the benefit of U.S. Provisional Application No. 62/247,201 filed on Oct. 28, 2015, which application is hereby incorporated by reference in its entirety.

BACKGROUND OF THE INVENTION

Field of the Invention

The invention relates to a non-volatile memory device, and more particularly to a read method and a non-volatile memory device that records read voltages, wherein the probability that the non-volatile memory device utilizes the read voltages to successfully decode codewords is high.

Description of the Related Art

Memories mainly include volatile memories and non-volatile memories. The access speed of each volatile memory is fast. After the volatile memory is powered off, data stored in the volatile memory are lost. Conversely, after the non-volatile memory is powered off, the data stored in the non-volatile memory are maintained. However, the data stored in the non-volatile memory may be lost after having been stored in non-volatile memory for too long, or the data can be interfered with by a read disturb or a program disturb. Therefore, if a fixed read voltage is utilized to read data, the non-volatile memory may not be able to read data successfully.

BRIEF SUMMARY OF THE INVENTION

In accordance with an embodiment, a non-volatile memory device includes a non-volatile memory and a controller. The non-volatile memory stores a plurality of data and a read table recording a plurality of indexes. The different indexes correspond to different read voltages. The controller establishes a standard table according to the indexes recorded in the read table and retrieves a first codeword stored in the non-volatile memory according to a read voltage corresponding to a first index recorded in the standard table. The controller executes an error check correction for the first codeword. When the first codeword passes the error check correction, the controller establishes a priority table according to the first index.

In accordance with another embodiment, a read method for a non-volatile memory device including a controller and a non-volatile memory configured to store a plurality of data and a read table, includes establishing a standard table according to a plurality of indexes recorded in the read table, wherein the different indexes correspond to different read voltages; reading a first codeword stored in the non-volatile memory according to a read voltage corresponding to a first index recorded in the standard table; executing an error check correction for the first codeword; and establishing a priority table according to the first index when the first codeword passes the error check correction.

In accordance with another embodiment, a non-volatile memory device includes a non-volatile memory and a controller. The controller establishes a standard table and at least one priority table according to a read table stored in the non-volatile memory. The controller first utilizes a read voltage corresponding to an index stored in the priority table to read and decode a codeword stored in the non-volatile memory. When the controller decodes the codeword unsuccessfully, the controller utilizes another read voltage corresponding to another index stored in the standard table to read and decode the codeword.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
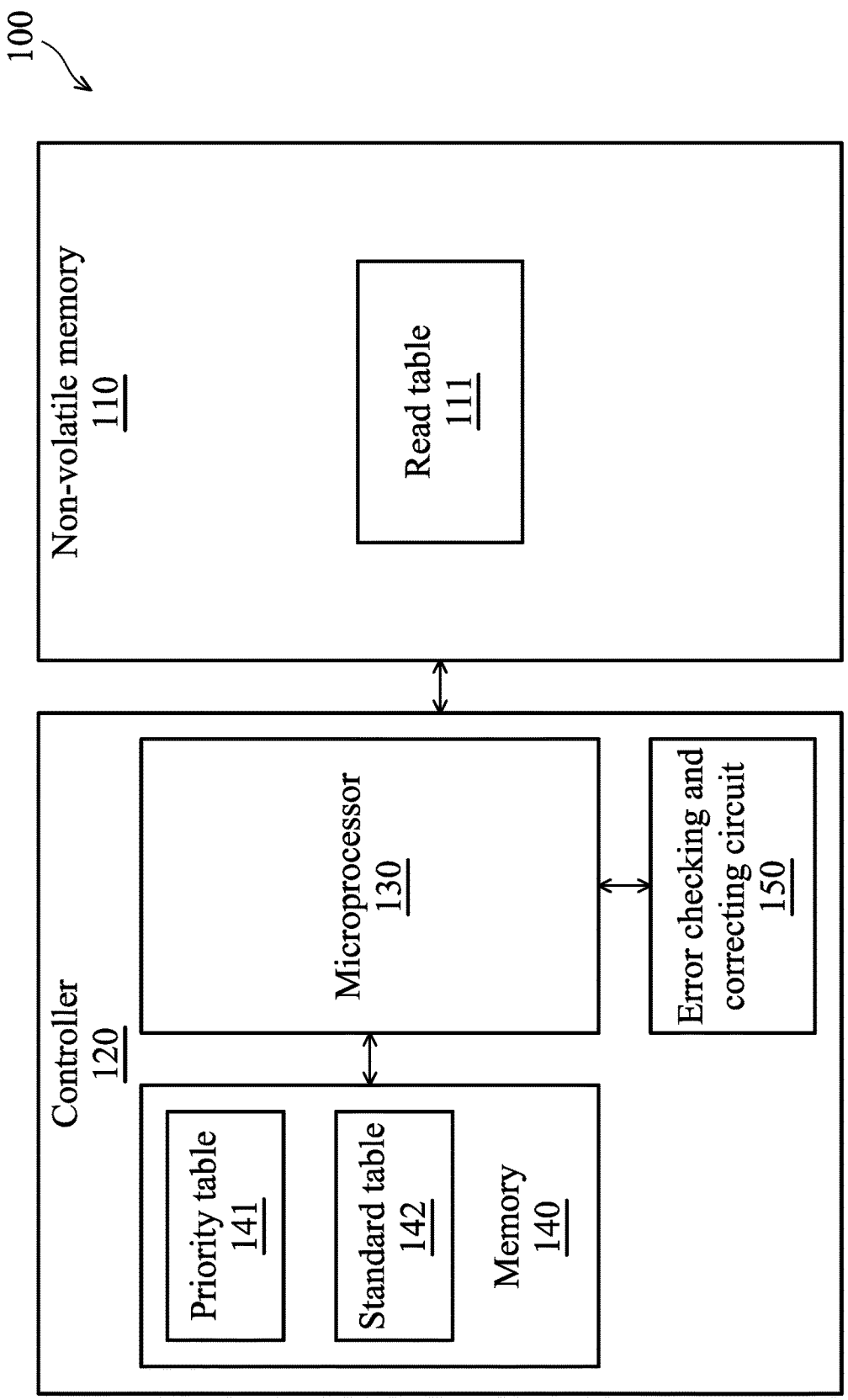
FIG. 1 is a schematic diagram of an exemplary embodiment of a non-volatile memory device, according to various aspects of the present disclosure.

FIG. 1 is a schematic diagram of an exemplary embodiment of a non-volatile memory device, according to various aspects of the present disclosure. The non-volatile memory device 100 includes a non-volatile memory 110 and a controller 120. In one embodiment, the non-volatile memory 110 is a NAND flash, but the disclosure is not limited thereto. The non-volatile memory 110 includes a plurality of cells. The invention does not limit the structures of cells. In one embodiment, each cell of the non-volatile memory 110 is a single-level cell to store one data bit. In another embodiment, each cell of the non-volatile memory 110 is a multi-level cell to store two data bits. In other embodiments, each cell of the non-volatile memory 110 is a triple-level cell to store three data bits.

The non-volatile memory 110 is configured to store a plurality of data and a read table 111. In this embodiment, the read table 111 records a plurality of indexes. Each index corresponds to a read voltage. Different indexes correspond to different read voltages. The read voltages are utilized to determine that the data stored in each cell of the non-volatile memory 110 is 0 or 1. In another embodiment, the read table 111 is stored in the non-volatile memory 110 beforehand.

The controller 120 is configured to access the non-volatile memory 110. In this embodiment, the controller 120 establishes a standard table 142 according to the indexes recorded in the read table 111. Then, the controller 120 utilizes the read voltages corresponding to the indexes stored in the standard table 142 to read data stored in the non-volatile memory 110. In another embodiment, the controller 120 does not establish the standard table. In this case, the controller 120 directly utilizes the read voltages corresponding to the indexes stored in the read table 111 to read the data stored in the non-volatile memory 110. As shown in FIG. 1, the controller 120 includes a microprocessor 130, a memory 140, and an error checking and correcting circuit 150.

The microprocessor 130 stores a write data into the non-volatile memory 110 according to a write command (not shown) sent by an external device (not shown) or reads data stored in the non-volatile memory 110 according to a read command (not shown) sent by the external device. For example, in a write mode, the microprocessor 130 provides a write data to the error checking and correction circuit 150 to generate an error correcting code and writes the write data and the error correcting code to the non-volatile memory 110. In a read mode, the microprocessor 130 utilizes the corresponding read voltages to read the previous write data and the corresponding error correcting code stored in the non-volatile memory 110 according to the indexes recorded in the standard table 142. In this embodiment, the previous write data with the corresponding error correcting code is referred to as a codeword.

In one embodiment, the microprocessor 130 retrieves the indexes recorded in the read table 111 and stores the retrieved indexes into the standard table 142. The invention does not limit how the microprocessor 130 retrieves the indexes recorded in the read table 111. The microprocessor 130 may successively or randomly retrieve the indexes recorded in the read table 111 and successively or randomly store the retrieved indexes into the standard table 142. The microprocessor 130 reads a first codeword in a first address of the non-volatile memory 110 according to the read voltages corresponding to a first index recorded in the standard table 142 stored in the memory 140 and sends the first codeword to the error checking and correcting circuit 150.

The error checking and correcting circuit 150 determines whether the number of error bits in the previous write data of the first codeword exceed a tolerance number according to the error correcting code of the first codeword. When the number of error bits in the previous write data of the first codeword exceed the tolerance number, the first codeword cannot pass an error check correction which is called that the first codeword is decoded fail. Therefore, the microprocessor 130 rereads the first codeword according to the read voltage corresponding to a second index of the standard table 142 and determines whether the first codeword can pass the error check correction. If the first codeword cannot pass the error check correction, the microprocessor 130 rereads the first codeword according to the read voltage corresponding to a third index of the standard table 142 and determines whether the first codeword can pass the error check correction. If the first codeword can pass the error check correction, it means that the error bits in the previous write data of the first codeword can be corrected by the error checking and correcting circuit 150. It is also called that the first codeword is successfully decoded by the error checking and correcting circuit 150. Therefore, the microprocessor 130 stores the third index (a specific index) in a priority table 141. In the next read operation, the microprocessor 130 first utilizes the read voltage corresponding to the third index recorded in the priority table 141.

After the microprocessor 130 establishes the priority table 141, if the microprocessor 130 performs another read operation, the microprocessor 130 reads a second codeword in a second address of the non-volatile memory 110 according to the read voltage corresponding to the index (e.g. the third index), which is recently recorded in the priority table 141 and executes the error check correction for the second codeword. The error checking and correcting circuit 150 determines whether the number of error bits in the previous write data of the second codeword exceed a tolerance number according to the error correcting code of the second codeword. When the number of error bits in the previous write data of the second codeword exceed the tolerance number, the second codeword cannot pass an error check correction. Therefore, the microprocessor 130 rereads the second codeword according to the read voltage corresponding to another index recorded in the priority table 141 and determines whether the second codeword can pass the error check correction. If the second codeword cannot pass the error check correction and the indexes recorded in the priority table 141 have been utilized by the microprocessor 130, the microprocessor 130 again selects the first index recorded in the standard table 142 and rereads the second codeword according to the read voltage corresponding to the first index and executes the error check correction. If the second codeword cannot pass the error check correction, the microprocessor 130 selects the second index recorded in the standard table 142 and performs the error check correction. If the second codeword cannot pass the error check correction, the microprocessor 130 selects a fourth index recorded in the standard table 142, rereads the second codeword according to the read voltage corresponding to the fourth index and executes the error check correction. If the second codeword cannot pass the error check correction, the microprocessor 130 selects a fifth index recorded in the standard table 142, rereads the second codeword according to the read voltage corresponding to the fifth index and executes the error check correction. If the second codeword can pass the error check correction, the microprocessor 130 stores the fifth index (a specific index) to the priority table 141. In the next read operation, the microprocessor 130 first utilizes the latest index (e.g. the fifth index) to be recorded in the priority table 141.

When the microprocessor 130 utilizes the read voltages corresponding to the indexes recorded in the priority table 141 to retrieve the codewords stored in the in the non-volatile memory 110, the probability that the codewords successfully pass the error check correction is increased. Therefore, if the microprocessor 130 utilizes the read voltages corresponding to the indexes recorded in the priority table 141 to read codewords, the probability that codewords are decoded unsuccessfully can be reduced and the probability that the codewords is successfully decoded is increased.

In one embodiment, if the number of indexes recorded in the priority table 141 exceeds a pre-determined number, the index which is recorded first in the priority table 141 is removed. In this embodiment, the indexes recorded in the priority table 141 are not recorded in the standard table 142 to avoid the microprocessor 130 repeatedly utilizing the same index. In other embodiments, after the microprocessor 130 stores an index recorded the standard table 142 into the priority table 141, the microprocessor 130 masks or deletes the corresponding index recorded the standard table 142. In this case, when an index recorded in the priority table 141 has been removed, the microprocessor 130 rewrites the index removed from the priority table 141 in the standard table 142 or unmasks the index masked in the standard table 142.

In this embodiment, the memory 140 of the controller 120 is configured to store the priority table 141 and the standard table 142, but the disclosure is not limited thereto. In other embodiments, the priority table 141 and the standard table 142 may be stored in two independent memories or at least one of the priority table 141 and the standard table 142 is stored in the non-volatile memory 110. In one embodiment, the memory 140 is a volatile memory, such as SRAM or DRAM, but the disclosure is not limited thereto. After the non-volatile memory device 100 is powered off, data or codewords stored in the memory 140 is removed. After the non-volatile memory device 100 is powered on, the microprocessor 130 establishes the standard table 142 again. In addition, the microprocessor 130 executes a read operation and the microprocessor 130 simultaneously establishes the priority table 141 to store each index with the higher probability that the microprocessor 130 successfully decodes the codewords in the priority table 141.

For example, when the non-volatile memory device is powered on, the microprocessor 130 copies all indexes from the read table 111 and stores the indexes in a standard table 142. In one embodiment, the sequence of the indexes recorded in the read table 111 may be the same as or different from the sequence of the indexes recorded in the standard table 142. Furthermore, the microprocessor 130 may successively or randomly retrieve the indexes recorded in the standard table 142.

Figure 2:
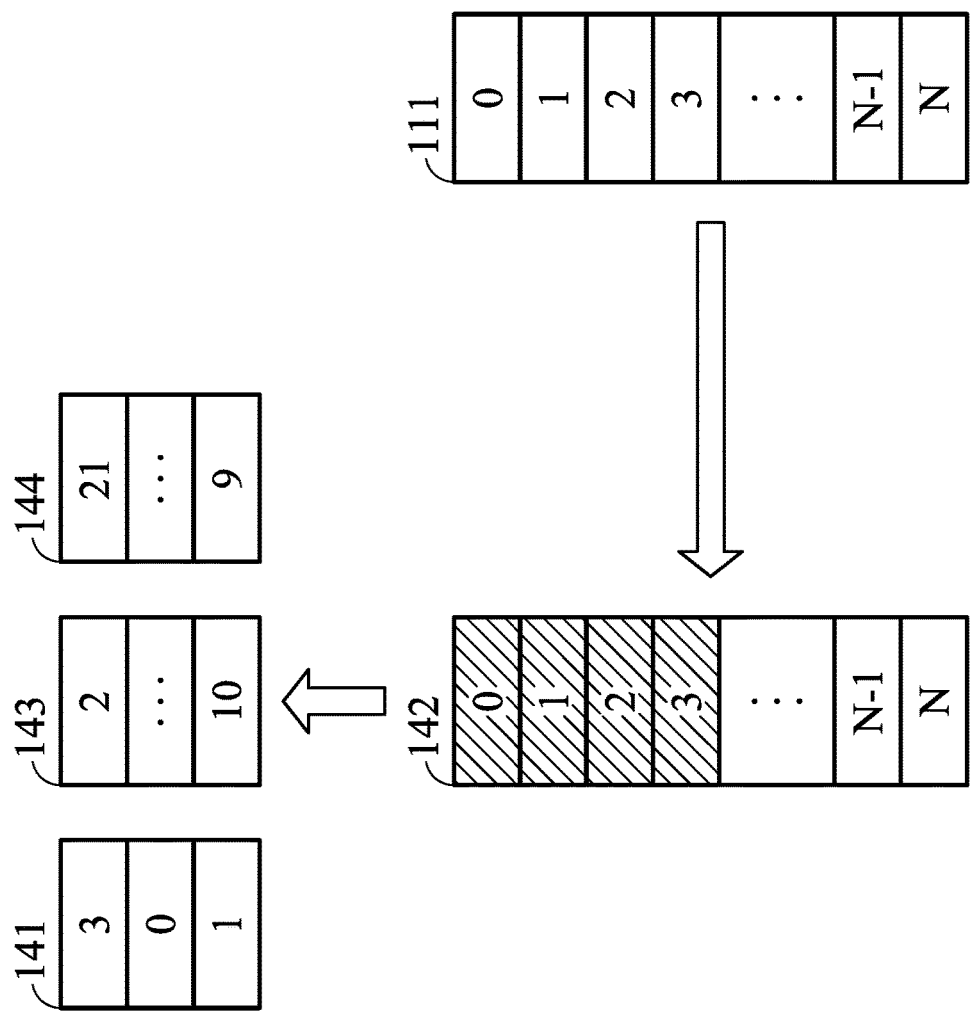
FIG. 2 is a schematic diagram of an exemplary embodiment of a read table, a standard table and priority tables, according to various aspects of the present disclosure.

FIG. 2 is a schematic diagram of an exemplary embodiment of the read table 111, the standard table 142 and priority tables 141, according to various aspects of the present disclosure. The read table 111 records a plurality of indexes. The number of indexes is N, wherein N>0. The different indexes correspond to different read voltages. In other embodiments, the read table 111 directly records different read voltages. In one embodiment, the standard table 142 and the priority table 141 directly record a plurality of read voltages.

In this embodiment, the microprocessor 130 establishes the standard table 142 according to the indexes recorded in the read table 111. As shown in FIG. 2, the sequence of the indexes recorded in the standard table 142 is the same as the sequence of the indexes recorded in the read table 111, but the disclosure is not limited thereto.

In a read operation, the controller 120 reads a codeword stored in the non-volatile memory 110 according to the read voltages corresponding to the indexes 0~N recorded in the standard table 142 and determines whether the codeword can pass an error check correction. If the codeword can pass the error check correction, the controller 120 stores the corresponding index to the priority table 141. For example, in a first read period, the controller 120 retrieves a first codeword stored in the non-volatile memory 110 according to the read voltage corresponding to the first index 0 of the standard table 142 and executes an error check correction for the retrieved first codeword.

If the first codeword cannot pass the error check correction, the controller 120 rereads the first codeword according to the read voltage corresponding to the second index 1 of the standard table 142 and executes the error check correction for the first codeword. When the first codeword passes the error check correction, the controller 120 establishes a priority table 141 according to the second index 1. In this case, the controller 120 stores the second index 1 to the priority table 141. Since the second index 1 of the standard table 142 has been stored in the priority table 141, the controller 120 masks or removes the second index 1 of the standard table 142 to avoid the controller 120 utilizing the second index 1 of the standard table 142 again.

If the controller 120 receives a read command again, the controller 120 reads a second codeword stored in the non-volatile memory 110 according to the read voltage corresponding to the second index 1 of the priority table 141 and executes the error check correction. If the second codeword cannot pass the error check correction and all indexes recorded in the priority table 141 have been utilized, the controller 120 selects another index recorded in the standard table 142. Since the second index 1 has been masked or deleted in the standard table 142, the controller 120 selects a specific index (e.g. 0) different from the second index 1 and utilizes the read voltage corresponding to the specific index to read the second codeword. Then, the controller 120 executes the error check correction. If the second codeword passes the error check correction, the controller 120 stores the specific index 0 to the priority table 141. In the next read operation, the controller 120 utilizes the read voltage corresponding to the index (e.g. the index 0) which was recently recorded in the priority table 141 to read the non-volatile memory 110.

In this embodiment, when the number of indexes recorded in the priority table 141 is higher than a pre-determined number (e.g. 3), the controller 120 removes the index (e.g. the second index 1) which is recorded first in the priority table 141 and unmasks the second index 1 recorded in the standard table 142 or rewrites the second index 1 to the standard table 142. In other embodiments, the number of indexes recorded in the priority table 141 is not limited. In one embodiment, the priority table 141 stores the indexes according to a first input first output (FIFO) method.

Furthermore, in the present invention, the number of priority tables is not limited. In one embodiment, the controller 120 establishes a plurality of priority tables 141, 143, and 144. The indexes recorded in the priority table 141 may be different from the indexes recorded in the priority tables 143 and 144. The controller 120 utilizes different priority tables during different management operations of the non-volatile memory. For example, the controller 120 establishes the priority table 141 when the controller 120 executes a data retention operation. Therefore, when the controller 120 executes the data retention operation again, the controller 120 utilizes the read voltages corresponding to the indexes recorded in the priority table 141 to read the non-volatile memory 110. In another embodiment, when the controller 120 executes a read operation for overcoming data disturbs, the controller 120 establishes the priority table 143. Therefore, when the controller 120 executes the read operation for overcoming the data disturbs again, the controller 120 utilizes the read voltages corresponding to the indexes recorded in the priority table 143 to read the non-volatile memory 110. In other embodiments, when the controller 120 executes a read operation for overcoming program disturbs, the controller 120 may establish the priority table 144. In this case, when the controller 120 executes the read operation for overcoming the program disturbs again, the controller 120 utilizes the read voltages corresponding to the indexes recorded in the priority table 144 to read the non-volatile memory 110.

The invention does not limit the number of read tables stored in the non-volatile memory 110. When each of the cells of the non-volatile memory 110 belongs to an SLC structure, the non-volatile memory 110 only stores one read table. However, when each cell of the non-volatile memory 110 belongs to an MLC structure, the non-volatile memory 110 may store two read tables. Therefore, the number of read tables is determined according to the structure of the non-volatile memory 110. In one embodiment, after producing the non-volatile memory 110, the manufacturer producing the non-volatile memory 110 stores a corresponding read table in the non-volatile memory 110. In another embodiment, a chip manufacturer establishes the read table or the standard table, processes the read table or the standard table to generate a firmware format, and stores the firmware format in the controller.

Figure 3:
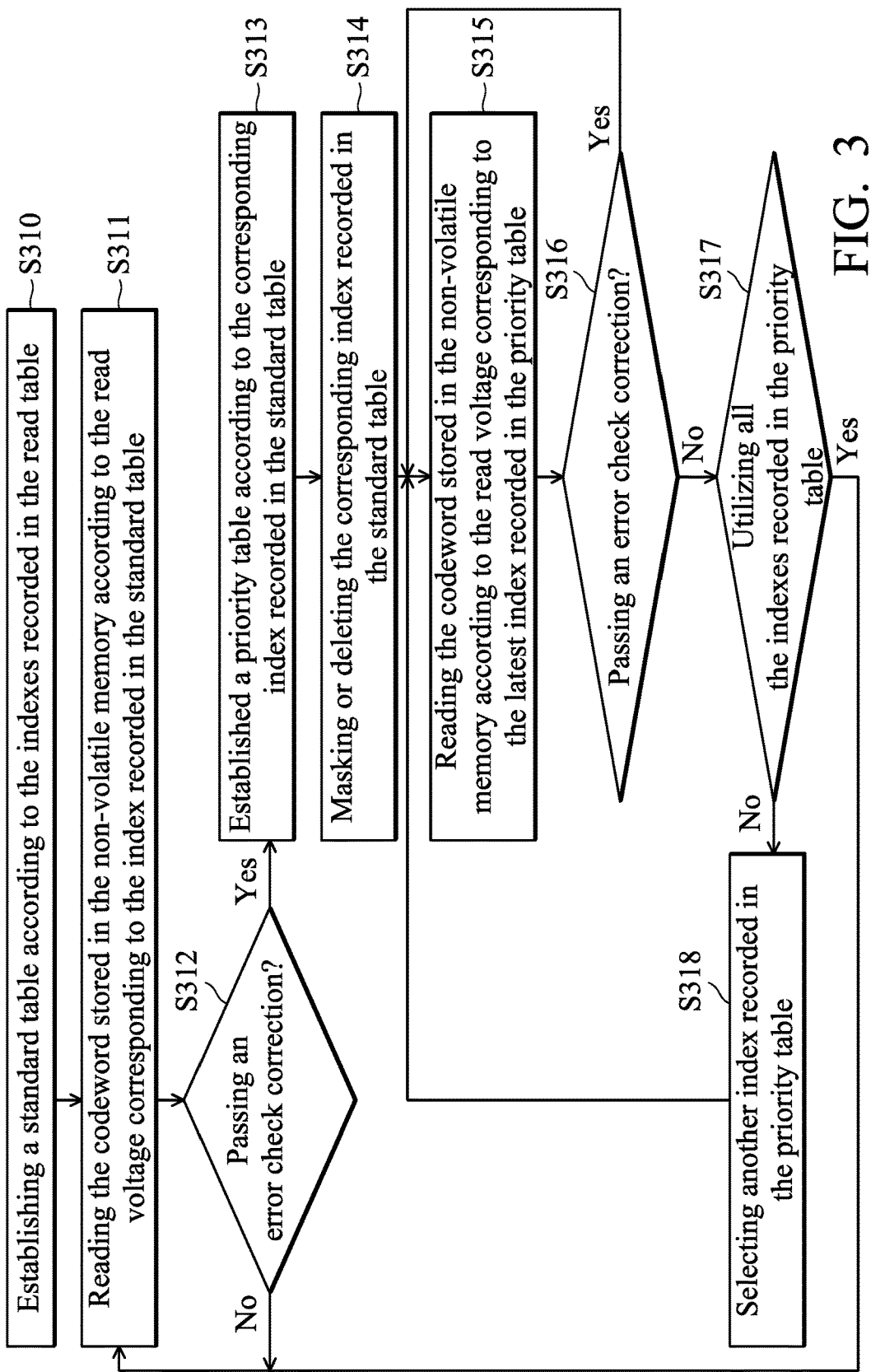
FIG. 3 is a flowchart of an exemplary embodiment of a read method, according to various aspects of the present disclosure.

FIG. 3 is a flowchart of an exemplary embodiment of a read method, according to various aspects of the present disclosure. The read method is applied to a non-volatile memory device. The non-volatile memory device includes a controller and a non-volatile memory. The non-volatile memory is configured to store a plurality of data and a read table. The controller reads the read table of the non-volatile memory. The read table may be pre-stored in the non-volatile memory by the manufacturer, but the disclosure is not so limited. The read table records a plurality of indexes. Each index corresponds to a read voltage. Different indexes correspond to different read voltages. In other embodiments, the read table records a plurality of read voltages.

First, a standard table is established according to the indexes recorded in the read table (step S310). In one embodiment, the controller retrieves the indexes recorded in the read table and stores the retrieved indexes to a standard table. Therefore, the indexes recorded in the standard table are the same as the indexes recorded in the read table. Additionally, in some embodiments, the sequence of the indexes recorded in the read table may be the same as or different from the sequence of the indexes recorded in the standard table.

Then, a first codeword stored in the non-volatile memory is read according to the read voltage corresponding to a first index recorded in the standard table (step S311). In one embodiment, the standard table is stored in a volatile memory, or the standard table and the read table are stored in the non-volatile memory.

Next, it is determined whether the first codeword can pass an error check correction (step S312). When the first codeword cannot pass an error check correction, it means that the read voltage corresponding to the first index is not satisfactory. Therefore, step S311 is executed again to utilize the read voltage corresponding to a second index recorded in the standard table to read the first codeword stored in the non-volatile memory. Then, the error check correction is executed (step S312).

When the first codeword can pass the error check correction, a priority table is established according to the second index (step S313). In one embodiment, the second index is stored in the priority table. The priority table may be stored in a volatile memory, or the priority table and the read table are stored in the non-volatile memory. Since the second index has been stored in the priority table, the second index recorded in the standard table is masked or deleted (step S314). The purpose of step S314 is to avoid repeatedly utilizing the unsatisfactory index. In other embodiments, step S314 can be omitted.

If the controller receives a new read command, the controller reads a second codeword stored in the non-volatile memory according to the read voltage corresponding to the latest index (e.g. the second index) to be recorded in the priority table (step S315).

Then, the error check correction is executed for the second codeword (step S316). When the second codeword does not pass the error check correction, it is determined whether all indexes recorded in the priority table have been utilized (step S317). In this case, since the priority table only records a single index, such as the second index, step S311 is executed again to select the read voltage corresponding to another index recorded in the standard table to read the second codeword.

The second index recorded in the standard table is masked or deleted. Therefore, in one embodiment, step S311 selects the first index again and utilizes the read voltage corresponding to the first index recorded in the standard table to read the second codeword. Step S312 determines whether the second codeword can pass the error check correction. If the second codeword cannot pass the error check correction, the read voltage corresponding to a third index is selected from the standard table 142 and is utilized to read the second codeword (step S311). Step S312 determines whether the second codeword can pass the error check correction. When the second codeword passes the error check correction, step S313 records the third index in the priority table. At this time, the priority table records two indexes, such as the second index and the third index.

Next, the third index recorded in the standard table is masked or deleted (step S314). In the next read operation, the non-volatile memory is read according to the read voltage corresponding to the latest index (e.g. the third index) to be recorded in the priority table (step S315) and the error check correction is executed (step S316). If the error check correction cannot be passed, it is determined whether all indexes recorded in the priority table have been utilized (step S317). If the outcome of step S317 is false, step S318 is performed to select another index (e.g. the second index) recorded in the priority table. Then, step S315 is performed to continuously read the second codeword and execute the error check correction (step S316). If the outcome of step S317 is true, step S311 is executed to select another index (e.g. the first index or a fourth index) from the standard table and steps S312 and S313 are performed to store the satisfactory index to the priority table.

In the present invention, the number of indexes recorded in the priority table is not limited. In one embodiment, when the number of indexes recorded in the priority table is higher than a pre-determined number, the index (e.g. the second index) which is recorded first in the priority table is removed and the second index recorded in the standard table is unmasked or the second index is re-written into the standard table.

In step S316, if the current codeword can pass the error check correction, step S315 is executed to decode other codeword according to the read voltage corresponding to the index that was recently recorded in the priority table. Since the read voltages corresponding to the indexes recorded in the priority table are utilized to decode the codewords and the read voltages have a high probability to successfully decode the codewords, when the controller reads the codewords stored in the non-volatile memory according to the read voltages corresponding to the index recorded in the priority table, the probability that the controller successfully decodes the codewords is high to reduce the time rereading the codeword and the time decoding the codeword and increase the read speed. Additionally, in other embodiments, when the non-volatile memory operates at different read operations, such as a data retention operation, a read operation for overcoming read disturbs, or a read operation for overcoming program disturbs, different priority tables are established and used to increase the probability of successfully decoding data.

In one embodiment, a non-volatile memory device includes a non-volatile memory and a controller. The controller establishes a standard table and at least one priority table according to a read table stored in the non-volatile memory. The controller first utilizes a read voltage corresponding to an index stored in the priority table to read and decode a codeword stored in the non-volatile memory. When the controller decodes the codeword unsuccessfully, the controller utilizes another read voltage corresponding to another index stored in the standard table to read and decode the codeword.

In one embodiment, the probability that the controller utilizes the read voltages corresponding to the indexes recorded in the priority table to successfully decode the codewords stored in the non-volatile memory is higher than the probability that the controller utilizes the read voltages corresponding to the indexes recorded in the standard table to successfully decode the codewords stored in the non-volatile memory.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory device comprising:
    a non-volatile memory storing a plurality of data and a read table recording a plurality of indexes, wherein the different indexes correspond to different read voltages; and
    a controller establishing a standard table corresponding to the indexes recorded in the read table, reading a first codeword stored in the non-volatile memory corresponding to a read voltage corresponding to a first index recorded in the standard table, and executing an error check correction for the first codeword,
    wherein when the first codeword passes the error check correction, the controller establishes a priority table corresponding to the first index, and wherein during a next read operation, the controller reads a second codeword stored in the non-volatile memory using the read voltage corresponding to the first index recorded in the priority table and executes the error check correction for the second codeword.

2. The non-volatile memory device as claimed in claim 1, wherein when the first codeword does not pass the error check correction, the controller reads the first codeword according to a read voltage corresponding to a second index recorded in the standard table and executes the error check correction for the first codeword.

3. The non-volatile memory device as claimed in claim 1, wherein the controller retrieves the indexes recorded in the read table to store in the standard table, and the standard table records the indexes.

4. The non-volatile memory device as claimed in claim 1, wherein when the first codeword passes the error check correction, the controller masks or deletes the first index recorded in the standard table.

5. The non-volatile memory device as claimed in claim 4, wherein when the number of indexes recorded in the priority table exceeds a pre-determined number, the controller removes the index which is recorded first in the priority table and the controller unmasks the index of the standard table, corresponding to the index removed from the priority table or writes the index into the standard table.

6. The non-volatile memory device as claimed in claim 1, wherein when the second codeword does not pass the error check correction, the controller reads the second codeword stored in the non-volatile memory according to a read voltage corresponding to another index recorded in the priority table.

7. The non-volatile memory device as claimed in claim 6, wherein when the controller unsuccessfully decodes the second codeword stored in the non-volatile memory according to each read voltage corresponding to each index recorded in the priority table, the controller reads the second codeword according to a read voltage corresponding to a specific index recorded in the standard table.

8. The non-volatile memory device as claimed in claim 1, wherein the controller establishes a plurality of priority tables and utilizes the different priority tables in different management operations of the non-volatile memory.

9. The non-volatile memory device as claimed in claim 1, wherein a sequence of the indexes recorded in the standard table is the same as a sequence of the indexes recorded in the read table.

10. The non-volatile memory device as claimed in claim 1, wherein the controller further comprises a volatile memory storing the priority table and the standard table.

11. The non-volatile memory device as claimed in claim 1, wherein a probability that the controller utilizes the read voltages corresponding to the indexes recorded in the priority table to successfully decode the codewords stored in the non-volatile memory is higher than a probability that the controller utilizes the read voltages corresponding to the indexes recorded in the standard table to successfully decode the codewords stored in the non-volatile memory.

12. A read method for a non-volatile memory device comprising a controller and a non-volatile memory configured to store a plurality of data and a read table, comprising:
    establishing a standard table corresponding to a plurality of indexes recorded in the read table, wherein the different indexes correspond to different read voltages;
    reading a first codeword stored in the non-volatile memory corresponding to a read voltage corresponding to a first index recorded in the standard table;
    executing an error check correction for the first codeword;
    establishing a priority table corresponding to the first index when the first codeword passes the error check correction,
    during a next read operation:
        reading a second codeword stored in the non-volatile memory using the read voltage corresponding to the first index recorded in the priority table; and
        executing an error check correction for the second codeword.

13. The read method as claimed in claim 12, further comprising:
    reading the first codeword according to a read voltage corresponding to a second index recorded in the standard table when the first codeword does not pass the error check correction; and
    executing the error check correction for the first codeword.

14. The read method as claimed in claim 12, wherein the step of establishing the standard table according to the indexes recorded in the read table comprises:
    retrieving the indexes recorded in the read table to store in the standard table, wherein the standard table records the indexes.

15. The read method as claimed in claim 12, further comprising:

masking or deleting the first index recorded in the standard table when the first codeword passes the error check correction.

16. The read method as claimed in claim 15, further comprising:
removing the index which is recorded first in the priority table and unmasking the index of the standard table, corresponding to the index removed from the priority table or writing the index removed from the priority table into the standard table when a number of indexes recorded in the priority table exceeds a pre-determined number.

17. The read method as claimed in claim 12, further comprising:
reading the second codeword stored in the non-volatile memory according to a read voltage corresponding to another index recorded in the priority table when the second codeword does not pass the error check correction.

18. The read method as claimed in claim 17, further comprising:
reading the second codeword according to a read voltage corresponding to a specific index recorded in the standard table when all the read voltages corresponding to all the indexes recorded in the priority table are utilized and the second codeword stored in the non-volatile memory is unsuccessfully decoded.

19. The read method as claimed in claim 12, further comprising:
establishing a plurality of priority tables, wherein the different priority tables are utilized in different management operations of the non-volatile memory.

20. The read method as claimed in claim 12, wherein a sequence of the indexes recorded in the standard table is the same as a sequence of the indexes recorded in the read table.

21. The read method as claimed in claim 12, further comprising:
storing the priority table and the standard table into a volatile memory.

22. The read method as claimed in claim 12, wherein a probability that the read voltages corresponding to the indexes recorded in the priority table are utilized to successfully decode the codewords stored in the non-volatile memory is higher than a probability that the read voltages corresponding to the indexes recorded in the standard table are utilized to successfully decode the codewords stored in the non-volatile memory.

23. A non-volatile memory device comprising:
a non-volatile memory; and
a controller establishing a standard table and at least one priority table corresponding to a read table stored in the non-volatile memory, wherein the controller reads a first codeword stored in the non-volatile memory corresponding to a read voltage corresponding to a first index recorded in the standard table, and executes an error check correction for the first codeword,
wherein when the first codeword passes the error check correction, the controller stores the first index in the priority table, and then the controller utilizes read voltages corresponding to the indexes stored in the priority table to read and decode codewords stored in the non-volatile memory, wherein when the controller utilizes the read voltages corresponding to the indexes stored in the priority table to unsuccessfully decode the codewords stored in the non-volatile memory, the controller utilizes read voltages corresponding to the indexes stored in the standard table to read and decode the codewords.

24. The non-volatile memory device as claimed in claim 23, wherein a probability that the controller utilizes the read voltages corresponding to the indexes recorded in the priority table to successfully decode the codewords stored in the non-volatile memory is higher than a probability that the controller utilizes the read voltages corresponding to the indexes recorded in the standard table to successfully decode the codewords stored in the non-volatile memory.

* * * * *